United States Patent [19]
Undercoffer

[11] Patent Number: 6,146,697
[45] Date of Patent: Nov. 14, 2000

[54] MT CVD PROCESS

[75] Inventor: Kenneth E. Undercoffer, Greensburg, Pa.

[73] Assignee: Kennametal Inc., Latrobe, Pa.

[21] Appl. No.: 09/261,001

[22] Filed: Mar. 2, 1999

[51] Int. Cl.$^7$ .................................................. C23C 16/14
[52] U.S. Cl. .............................. 427/255.391; 427/255.39; 427/255.394; 427/249.17; 427/249.19; 51/307; 407/119
[58] Field of Search ...................... 427/255.391, 255.392, 427/255.39, 255.394, 249.17, 249, 19; 51/307; 407/119

[56] References Cited

U.S. PATENT DOCUMENTS

| | | |
|---|---|---|
| 3,846,162 | 11/1974 | Bloom . |
| 4,196,233 | 4/1980 | Bitzer et al. . |
| 5,205,903 | 4/1993 | Suzuki et al. . |
| 5,436,071 | 7/1995 | Odani et al. . |
| 5,589,223 | 12/1996 | Odani et al. . |
| 5,652,045 | 7/1997 | Nakamura et al. . |
| 5,681,651 | 10/1997 | Yoshimura et al. . |
| 5,693,408 | 12/1997 | Van Den Berg et al. . |
| 5,705,263 | 1/1998 | Lenander et al. . |
| 5,786,069 | 7/1998 | Ljungberg et al. . |
| 5,800,868 | 9/1998 | Lenander et al. . |

FOREIGN PATENT DOCUMENTS

| | | |
|---|---|---|
| 0678594 A1 | 10/1995 | European Pat. Off. . |
| WO 98/02598 | 1/1998 | WIPO . |

OTHER PUBLICATIONS

N. Yoshikawa and A. Kikuchi, "Simulation of Growth Rate of Chemical–Vapour–Deposited TiN Film along the Axial Direction in a Tubular Reactor," Materials Transactions, JIM, vol. 35, No. 9 (1994), pp. 611–615.

C. Wohlrab, "Tantalum and Tantalum Carbides CVD–Deposited on WC/Co Hardmetal and Stainless Steel," International Journal of Refractory Metals and Hard Metals, 9(4), Dec. 1990, pp. 192–199 (German and English Translation).

A.T. Santhanam and D.T. Quinto, "Surface Engineering of Carbide, Cermet, and Ceramic Cutting Tools," ASM Handbook, vol. 5, Surface Engineering (1994), pp. 900–908.

G.F. Wakefield et al., "Preparation of Titanium Carbonitride from Mono–, Di–, and Tri–Methyl Amines" (date and periodical unknown), pp. 173–180.

R.S. Bonetti et al., "CVD of Titanium Carbonitride at Moderate Temperature: Properties and Applications," MPR, Dec. 1990. No Page No.!

E. Kubel, "New CVD–Coatings for Carbide Insert," pp. 27–1 to 27–9 (date and publication unknown).

H.O. Pierson, "Titanium Carbonitrides Obtained by Chemical Vapor Deposition," Thin Sold Films, 40 (1977), pp. 41–47.

R.S. Bonetti et al., "CVD of Titanium Carbonitride at Moderate Temperatures, Properties and Applications," Surface Modification Technologies III, T.S. Sudarshan and D.G. Bhat, editors, The Minerals, Metals & Materials Society, 1990, pp. 291–308.

Anonymous: "LPCVD Gas Injection Ramps," IBM Technical Disclosure Bulletin, vol. 29, No. 10, Mar. 1, 1987, pp. 4451–52.

*Primary Examiner*—Roy V. King
*Attorney, Agent, or Firm*—John J. Prizzi

[57] ABSTRACT

The present invention comprises a method for coating at least one substrate with a carbonitride-containing coating by a MT CVD process which includes heating a substrate or substrates to a reaction temperature in a reaction chamber and then introducing into the reaction chamber a deposition process gas comprising from about 1 to about 30% of a hydrogen halide and predetermined amounts of a carbon/nitrogen source, a metal-halogen compound, $H_2$, and optionally $N_2$ so that a layer of the carbonitride-containing coating deposits on the surface of the substrates or substrates. The present invention also includes embodiments for coating at least one substrate with a carbonitride-containing coating by a MT CVD process which includes maintaining a temperature gradient in the reaction chamber during the introduction of the deposition process gas into the reaction chamber. Carbonitride-containing coatings that may be applied by the method include carbonitrides, oxycarbonitrides, and borocarbonitrides of Ti, Hf, Zr, V, Nb, and Ta and their mixtures and alloys.

47 Claims, 2 Drawing Sheets

MT CVD PROCESS

FIELD OF THE INVENTION

The present invention relates to a method for coating substrates using a MT (medium temperature) CVD process.

BACKGROUND

Chemical vapor deposition (CVD) is used to apply single or multiple layers of coatings to substrate surfaces. Typically, the thickness of each coating layer may be on the order of a fraction of a micron to around twenty microns. In CVD, a gas or gases containing the atoms that will make up the coating are reduced or decomposed on or very near to a substrate surface at high temperatures so that a coating of a desired composition is deposited onto the substrate. The deposition can be a metal, a semiconductor, an alloy or a refractory compound.

MT CVD differs from CVD in that the reaction temperatures used for MT CVD are significantly lower than those used for CVD. Often the temperature difference is on the order of hundreds of degrees. One way of achieving the reduced temperature of MT CVD is by the use of a reactant gas or gases that are capable of reacting to form the desired coating at the lower temperatures.

Titanium carbonitride (TiCN) coatings can be deposited by either CVD or MT CVD. The deposition of a TiCN coating by CVD and by MT CVD has been found to be useful for imparting a wear resistant, hard coating on substrates. An example of a CVD process for depositing TiCN coatings is one which uses a deposition process gas containing methane ($CH_4$) as a reactant along with titanium tetrachloride ($TiCl_4$) and molecular hydrogen ($H_2$) to form a TiCN coating at a reaction temperature of about 1000° C. If the reactant gas $CH_4$ in this deposition process gas is replaced by acetonitrile ($CH_3CN$ gas), a MT CVD process is obtained by which a TiCN coating can be deposited on a substrate in the reaction temperature range of 700 to 900° C.

In MT CVD processes which use $CH_3CN$ in the deposition process gas along with $TiCl_4$ and $H_2$, a layer of TiCN is formed by a reaction that is represented by the following formula:

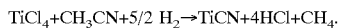

$$TiCl_4 + CH_3CN + 5/2\ H_2 \rightarrow TiCN + 4HCl + CH_4.$$

The use of MT CVD processes employing $CH_3CN$ as part of the deposition process gas for coating substrates with one or more layers of TiCN is well known in the art. For example, Bitzer et al., U.S. Pat. No. 4,196,233, describes processes for coating inorganic substrates with, among other things, carbonitrides, and discloses the use of a MT CVD coating process employing $CH_3CN$. A. T. Santhanam and D. T. Quinto, "Surface Engineering of Carbide, Cermet, and Ceramic Cutting Tools," ASM Handbook, Vol. 5, Surface Engineering (1994), pages 900–908, relate that in the mid-1980s a MT CVD process for depositing TiCN on cemented carbides was commercialized. They describe that process as using a deposition process gas containing a mixture of $TiCl_4$, $H_2$, and an organic carbon-nitrogen compound such as $CH_3CN$ and a reaction temperature of 700 to 900° C. to produce faster deposition rates at lower temperatures than conventional CVD processes. They relate that the process had the advantage of producing fewer thermally induced tensile cracks than the higher temperature conventional CVD processes.

Over the years, refinements to MT CVD processes employing $CH_3CN$ have been made. For example, Odani et al, U.S. Pat. No. 5,436,071 describes the application of a TiCN coating on cermets using a reaction gas composed of 0.1~1% of $CH_3CN$, 1~5% of $TiCl_4$, 0~25% of molecular nitrogen ($N_2$) with the remaining portion being composed of $H_2$, under a reaction temperature of 800~900° C. and a reaction pressure of 30~200 Torr.

Although the prior art MT CVD processes have been commercially useful, they have some disadvantages. One disadvantage which is of particular importance commercially is that the rate of deposition of TiCN, although faster than that of some CVD processes, is still somewhat slow. The slow deposition rate contributes to the long batch cycle times needed to coat substrates and thereby adversely affects production rates.

Another disadvantage encountered with prior art MT CVD processes is that they often produce a variation in coating thicknesses throughout the MT CVD reaction chamber. Due to this problem, substrates located near the entrance of the deposition process gas often have significantly thicker coatings than those located farther away from the deposition process gas entrance.

SUMMARY

The inventor of the present invention has made the surprising discovery that the addition of, volumetrically, from about 1 to about 30% of hydrogen chloride (HCl) gas to a MT CVD deposition process gas which also comprises predetermined amounts of $CH_3CN$, $TiCl_4$, $H_2$ gases, and optionally molecular nitrogen ($N_2$) gas, results in a significant increase in the deposition rate of the TiCN coating at a given reaction temperature. Accordingly, the present invention provides a method for coating at least one substrate with a coating of TiCN by a MT CVD process which includes heating a substrate or substrates to a reaction temperature in a reaction chamber and then introducing into the reaction chamber a deposition process gas comprising from about 1 to about 30% HCl and predetermined amounts of $CH_3CN$, $TiCl_4$, $H_2$, and optionally $N_2$, so that a layer of TiCN deposits on the surface of the substrate or substrates.

The present invention may be used with any desired substrate that is compatible with the MT CVD process. Examples of such substrates include, but are not limited to ceramics, cemented carbides, cermets, high speed steels and other types of steels. The present invention may be used with substrates on which one or more coating layers of TiCN or of other coating compositions have been applied. The present invention may also be used to deposit a layer or layers of TiCN which will subsequently, or even intermittently, be overlaid with coating layers deposited by other methods. These underlying or overlaying layers may be applied by the method of the present invention or by other coating deposition methods. Examples of such other coating deposition methods include, but are not limited to, CVD, conventional MT CVD, physical vapor deposition (PVD), or combinations and variations thereof including those variations which use plasma enhancements.

Whenever the present invention is employed to apply a coating of TiCN over another coating layer on a substrate, it is to be understood in this context in this specification and the claims appended hereto that reference to the "surface" of such a substrate refers to the surface of the outermost layer on the substrate. For example, a reference herein to applying a coating of TiCN by a method of the present invention to the surface of a substrate where, at the moment prior to applying the TiCN layer, the substrate already has three preexisting coating layers with a layer of TiN as the innermost layer, a layer of TiCN as an intermediate layer, and another layer of TiN as an outermost layer, that reference is to be understood as referring to applying a TiCN coating by a method of the present invention to the outside surface of the outermost layer of TiN.

The substrate that is to be coated by the present invention may be of any geometry compatible with the MT CVD process. The present invention is particularly useful for coating cutting tools of various geometries. For example, the present invention may be used with, but is not limited to use with, substrates in the form of cutting tools for turning, milling or hole making. Examples of such cutting tools include, but are not limited to, indexable cutting inserts and elongate rotary tools such as drills, end mills, taps, reamers, and broaches.

The inventor has also discovered the surprising result that in some embodiments of the present invention, the significant increase in deposition rate of the TiCN coating is accompanied by a significant improvement in the uniformity of the deposited TiCN coating thicknesses throughout the MT CVD reaction chamber. This aspect of the present invention is particularly advantageous when a plurality of substrates located throughout a reaction chamber are being simultaneously coated. In such a case, the prior art MT CVD processes that employ $CH_3CN$ cause a variability in the thickness of the TiCN coating deposited on the substrates depending on the location of a particular substrate with respect to the location of the entry into the reaction chamber of the deposition process gas. Some preferred embodiments of the present invention significantly reduce this location-dependent TiCN coating thickness variability while at the same time increasing the deposition rate of the TiCN coating.

The inventor has also discovered the surprising result that the TiCN coating deposition rate and the uniformity of the TiCN coating thickness applied during the MT CVD process can be further controlled by the use of a temperature gradient in the reaction chamber in conjunction with the use of a deposition process gas comprising from about 1 to about 30% HCl and predetermined amounts of $CH_3CN$, $TiCl_4$, $H_2$, and optionally $N_2$. Thus, the present invention also includes embodiments for coating at least one substrate with a coating of TiCN by a MT CVD process which includes maintaining a temperature gradient in the reaction chamber during the introduction into the reaction chamber of a deposition process gas comprising from about 1 to about 30% HCl and predetermined amounts of $CH_3CN$, $TiCl_4$, $H_2$, and optionally $N_2$, so that a layer of TiCN is deposited on the surface of the substrate or substrates.

The inventor also contemplates the present invention to include the use of a deposition process gas wherein one or more of the aforementioned component gases are replaced in whole or in part by another gas or gases. For example, the inventor contemplates in some embodiments of the present invention that in the deposition process gas $CH_3CN$ may be replaced by another gaseous compound which can act as a carbon/nitrogen source for the deposited coating, HCl may be replaced by another gaseous hydrogen halide, and $TiCl_4$ may be replaced by another gaseous metal-halogen compound as a metal source for the coating. The inventor also contemplates the present invention to include the use of a deposition process gas wherein predetermined amounts of one or more additional reactive gases are included in the deposition process gas. For example, the inventor contemplates in some embodiments that predetermined amounts of one or more additional reactive gases may be added that supply one or more additional elements to the coating, such as oxygen or boron. Embodiments of the present invention which include such deposition process gas replacements and additions may result in the deposition of a carbonitride-containing coating other than TiCN. Such other carbonitride-containing coatings include oxycarbonitride and borocarbonitride coatings.

Thus, the present invention comprises a method for coating at least one substrate with a carbonitride-containing coating by a MT CVD process which includes heating a substrate or substrates to a reaction temperature in a reaction chamber and then introducing into the reaction chamber a deposition process gas comprising from about 1 to about 30% of a hydrogen halide and predetermined amounts of a carbon/nitrogen source, a metal-halogen compound, $H_2$, and optionally $N_2$ so that a layer of the carbonitride-containing coating deposits on the surface of the substrates or substrates. In such a method, the deposition process gas may also include predetermined amounts of an additional reactive gas or gases. The present invention also comprises a method for coating at least one substrate with a carbonitride-containing coating by a MT CVD process which includes maintaining a temperature gradient in the reaction chamber during the introduction into the reaction chamber of a deposition process gas comprising from about 1 to about 30% of a hydrogen halide and predetermined amounts of a carbon/nitrogen source, a metal-halogen compound, $H_2$, and optionally $N_2$ so that a layer of the carbonitride-containing coating is deposited on the surface of the substrate or substrates. In such a method, the deposition process gas may also include predetermined amounts of an additional reactive gas or gases.

The present invention also encompasses substrates coated by the process of the present invention.

These and other features and advantages inherent in the subject matter claimed and disclosed will become apparent to those skilled in the art from the following detailed description of presently preferred embodiments thereof and to the appended drawing.

BRIEF DESCRIPTION OF THE DRAWINGS

The drawing is provided only as an aid in understanding the operation of the present invention. It is to be understood, therefore, that the drawing is provided solely for the purpose of illustration and not as a definition of the limits of the present invention.

DETAILED DESCRIPTION

Figure 1:
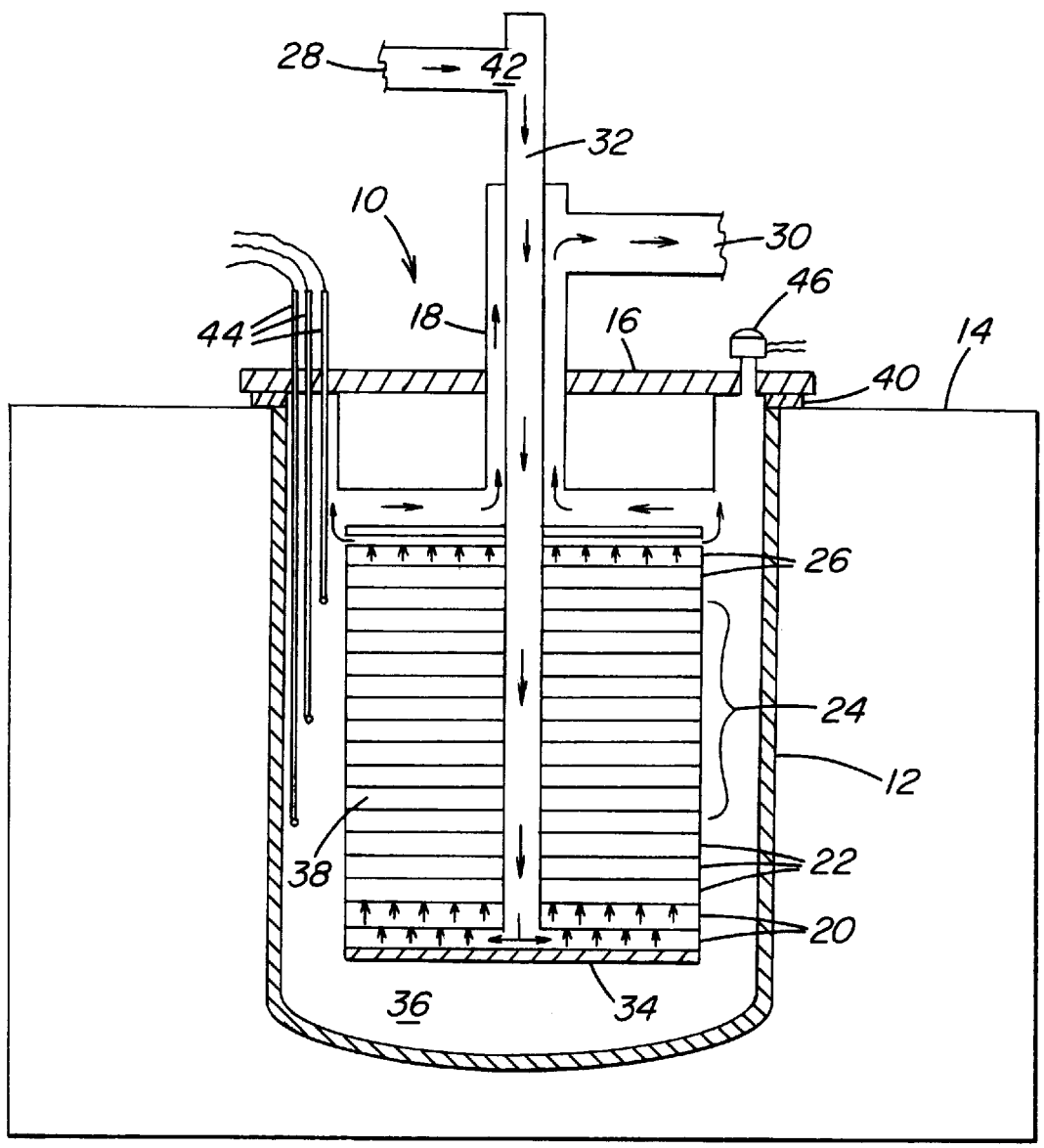
FIG. 1. shows a schematic of a cross-section of a conventional MT CVD reaction vessel.

In some preferred embodiments of the present invention, the MT CVD process is conducted using the following deposition process gas composition, reaction temperature, and reaction chamber pressure ranges.

The deposition process gas preferably contains, volumetrically, from about 1 to about 30% HCl, from about 0.2 to about 3.0% $CH_3CN$, from about 0.5 to about 5.0% $TiCl_4$, from 0 to about 35% $N_2$, and from about 40 to about 98% $H_2$. More preferably the deposition process gas contains from about 2.3 to about 20% HCl, from about 0.3 to about 0.7% $CH_3CN$, from about 0.9 to about 2.1% $TiCl_4$, from about 10 to about 30% $N_2$, and from about 50 to about 85% $H_2$.

The reaction temperature is preferably in the range of from about 550 to about 900° C. and more preferably from about 700 to less than about 900° C. Most preferably, the reaction temperature is in the range of from about 830 to about 880° C. In some embodiments of the present invention, a temperature gradient is used in the reaction chamber so that the substrate or substrates proximal to the entrance location or locations of the deposition process gas are heated to a lower reaction temperature than the substrate or substrates most remote from the entrance location or locations of the deposition process gas. The inventor has found that such a gradient can be used to further control the TiCN coating deposition rate and the uniformity of the TiCN coating thickness applied during the MT CVD process conducted in accordance with the present invention. Preferably, such a temperature gradient is in the range of about from 10 to about 100° C. and more preferably in the range of about 30 to about 50° C.

The reaction pressure is preferably in the range of from about 5 to about 800 Torr. More preferably, the reaction pressure is in the range of about 40 to about 120 Torr.

In some embodiments of the present invention, a deposition process gas is used wherein one or more of the component gases of HCl, $CH_3CN$, and $TiCl_4$ are substituted in whole or in part by another gas. Thus, for example, in some embodiments of the present invention, a deposition process gas is used in which the component gas $CH_3CN$ is replaced, in whole or in part, by another carbon-nitrogen source for the coating such as one or more of the gases monomethylamine ($CH_3NH_2$) dimethylamine (($CH_3$)$_2NH$), trimethylamine (($CH_3$)$_3N$), hydrogen cyanide (HCN), and dimethylhydrazine ($CH_3$(NH)$_2CH_3$). Likewise, some embodiments of the present invention include the use of a deposition process gas wherein HCl is replaced, in whole or in part, by another hydrogen halide such as hydrogen iodide (HI), hydrogen bromide (HBr) or hydrogen flouride (HF). Similarly, some embodiments of the present invention include the use of a deposition process gas wherein $TiCl_4$ is replaced, in whole or in part, by another gas or gases which act as a Ti metal source for the coating, such as the flourides, bromides, or iodides of Ti.

In some embodiments of the present invention, a deposition process gas is used in which predetermined amounts of one or more additional reactive gases are included. For example, the deposition process gas may include predetermined amounts at least one of carbon monoxide (CO) and carbon dioxide ($CO_2$).

In the practice of some embodiments of the present invention in which one or more of the component gases of the deposition process gas are substituted for and some embodiments in which the deposition process gas includes a predetermined amount of an additional reactive gas or gases, the deposited coating may be a carbonitride-containing coating other than TiCN. For example, in the practice of embodiments of the present invention in which $TiCl_4$ is replaced, in whole or in part, in the deposition process gas with a chloride, flouride, bromide or iodide of a metal such hafnium (Hf), niobium (Nb), vanadium (V), zirconium (Zr) or tantalum (Ta) or their mixtures and alloys with each other and/or titanium, the coating which is deposited may contain the metal of that chloride, flouride, bromide or iodide substituting in whole or in part for Ti thus producing a coating of a carbonitride of Hf, Nb, V, Zr, or Ta or their alloys or mixtures with each other and/or titanium. For example, in an embodiment of the present invention wherein zirconium tetrachloride ($ZrCl_4$) is wholly substituted for $TiCl_4$ in the deposition process gas, a coating of ZrCN is deposited instead of TiCN.

Similarly, embodiments of the present invention employing an additional gas component or components in the deposition process gas may result in carbonitride-containing coatings other than TiCN being deposited. For example, the addition of carbon monoxide (CO) or carbon dioxide ($CO_2$) to the deposition process gas may result in the deposition of the carbonitride-containing coating titanium oxycarbonitride (TiCON). Where the process deposition gas includes both an addition of CO or $CO_2$ and a substitution for $TiCl_4$ with a chloride, flouride, bromide or iodide of Hf, Nb, V, Zr, or Ta or their mixtures and alloys with each other and/or titanium, a carbonitride-containing coating of an oxycarbonitride of Hf, Nb, V, Zr, or Ta or their alloys or mixtures with each other and/or titanium is deposited. As another example, the addition of boron chloride ($BCl_3$) to the deposition process gas results in the deposition of the carbonitride-containing coating titanium borocarbonitride (TiBCN). Furthermore, where the process deposition gas includes both an addition of $BCl_3$ and a substitution for $TiCl_4$ with a chloride, flouride, bromide or iodide of Hf, Nb, V, Zr, or Ta or their alloys or mixtures with each other and/or titanium, a carbonitride-containing coating of a borocarbonitride of Hf, Nb, V, Zr, or Ta or their alloys or mixtures with each other and/or titanium is deposited.

In embodiments of the present invention in which one or more of the component gases of the deposition gas is substituted for and in embodiments in which the deposition process gas includes an additional reactive gas or gases, preferably the MT CVD reaction pressure is in the range of from about 5 to about 800 Torr, the reaction temperature is in the range of from about 550 to about 900° C., and, where a temperature gradient is used, the temperature gradient is in the range of from about 10 to about 100° C. Also in such embodiments, the deposition process gas preferably contains, volumetrically, from about 1 to about 30% of a hydrogen halide, from about 0.2 to about 3.0% of a carbon/nitrogen source, from about 0.5 to about 5.0% of a metal-halogen compound, from 0 to about 35% $N_2$, and from about 40 to about 98% $H_2$. Where the deposition process gas also includes predetermined amounts of one or more additional reactive gases, such as CO or $CO_2$, the amount of each such additional gas is preferably from about 0.1 to about 5.0%.

The following examples are given for illustration of some preferred embodiments the present invention but are not to be construed as limiting the present invention.

EXAMPLE 1

Tests were conducted to compare the TiCN coating deposition rate and coating thickness uniformity throughout the reaction chamber produced by an embodiment of the present invention with that produced by a conventional MT CVD technique. Similar processing conditions were used for both tests. The primary difference between Test A, which was conducted according to an embodiment of the present invention, and Test B, which was conducted according to a conventional MT CVD process, was the composition of the deposition process gas used. The tests consisted of applying a single coating of TiCN on a substrate. The TiCN coating thickness was then measured using a standard measurement technique on samples taken from predetermined locations throughout the reaction chamber. These locations were at varying distances from the entrance of the deposition process gas into the reaction chamber.

The MT CVD process tests were conducted in a conventional MT CVD reaction vessel having a retort with a diameter of approximately 20 inches (51 cm) and a length approximately 43.5 inches (110 cm). The reaction vessel is depicted schematically in FIG. 1. Referring to FIG. 1, the reaction vessel 10, included a retort 12, a furnace 14, a head closure 16, a support tree 18, two gas distribution manifold trays 20, three gas heating trays 22, eleven substrate support trays 24, top insulator trays 26, a gas inlet port 28, and a gas exhaust port 30. Support tree 18 included a hollow conduit 32 which was in fluid communication with gas inlet port 28 and gas distribution trays 20. Support tree 18 also included a support plate 34 on which were stacked gas distribution manifold trays 20, gas heating trays 22, substrate support trays 24, and top insulator trays 26. There was fluid communication between hollow conduit 32, gas distribution manifold tray 20, gas heating trays 22, substrate support trays 24, top insulator trays 26, and retort cavity 36 such that a stream of gas flow could be maintained from hollow conduit 32 through trays 20–26 and into retort cavity 36. Reaction chamber 38 comprised the intercommunicating interior portions of substrate support trays 24.

Gas distribution manifold tray 20, gas heating trays 22, substrate support trays 24, and top insulator trays 26 were constructed of graphite. Retort 12, head closure 16, and support tree 18 were constructed out of a heat resistant metal such as Inconel 718. Water-cooled gasket 40 made a gas-tight seal between retort 12 and head closure 16 so that during operation reaction vessel 10 could be evacuated by a vacuum pump through gas exhaust port 30 and back filled with a gas through gas inlet port 28.

Gas heating trays 22 contained small ceramic beads approximately 0.25 inches in diameter (0.6 cm) which served to heat deposition process gas 42. Top insulator trays 26 also contained small ceramic beads. Substrate support trays 24 contained rods for supporting the substrates which were to be coated. The inside diameter of gas inlet port 28 was approximately 1.4 inches (4 cm) and the inside diameter of gas outlet port 30 was approximately 1.9 inches (5 cm). Trays 20–26 had outside diameters of about 18 inches (46 cm) and inside diameters of about 17 inches (43 cm).

During operation, the constituent gases comprising deposition process gas 42 were premixed and heated to about 150 to about 180° C. prior to deposition process gas 42 entering gas inlet port 28. During the MT CVD process, deposition process gas 42 flowed from gas inlet port 28, down through hollow conduit 32 of support tree 18, and into gas distribution manifold 20. From there, deposition process gas 42 traveled through the ceramic beads in gas heating trays 22 where it was heated prior to flowing past the substrates supported in substrate support trays 24 where it reacted at the reaction temperature to form a TiCN coating on the substrates. Deposition process gas 42 exited topmost support tray 24 into top insulator trays 26 and then passed into retort cavity 36 before eventually flowing out of reaction vessel 10 through gas outlet port 30.

The substrates used in Tests A and B were tungsten carbide having a composition of WC-6.3% Co-3.5% Ta-2% Ti-1.5% Nb. The substrates were cutting tools having the geometry of Kennametal Style SNMA433. These substrates had been precoated with a thin layer of TiN to avoid a reaction between the underlying cemented carbide and the TiCN layer that was deposited in the tests.

The substrates were cleaned by conventional techniques familiar to those skilled in the art prior to the substrates being loaded into sample support trays 24. Approximately 3,000 to 4,000 substrates were distributed evenly among the eleven substrate support trays 24.

After the substrate loading was completed, the reaction vessel was assembled. The air was evacuated from the retort cavity 36 to reduce the pressure to about 20 Torr. The retort cavity 36 was then backfilled with $H_2$ to about 1 atmosphere (760 Torr) pressure. Furnace 14 was then used to heat the substrates to a reaction temperature of about 870° C. over a period of about 3 hours. The temperature was measured using thermocouples 44. The temperature was then stabilized for about 15 minutes. The pressure in reaction vessel 10 was then reduced to about 90 Torr as measured by pressure transducer 46. The flow of the deposition process gas 42 was then begun and continued for about 180 minutes while the substrates were maintained at the reaction temperature. During this time, the pressure in reaction vessel 10 was maintained at approximately 120 Torr.

The compositions of the deposition process gases used in Tests 1 and 2 are given in Table 1. The MT CVD operational parameters used for the tests are given in Table 2.

At the end of the deposition process gas flow time, the flow of the deposition process gas was halted and retort vessel 10 was purged with a mixture of $H_2$ and $N_2$ gas. The reaction vessel was cooled over several hours and then opened. Substrates for TiCN coating thickness measurement were then removed from the 1st, 4th, 8th, and 11th trays, counting from the bottom of the stack of eleven substrate support trays 24. Thus, the measurement samples taken from Tray 1 were closest to the entrance of the deposition process gas into the reaction chamber and those taken from Tray 11 were the most remote from that entrance.

Figure 2:
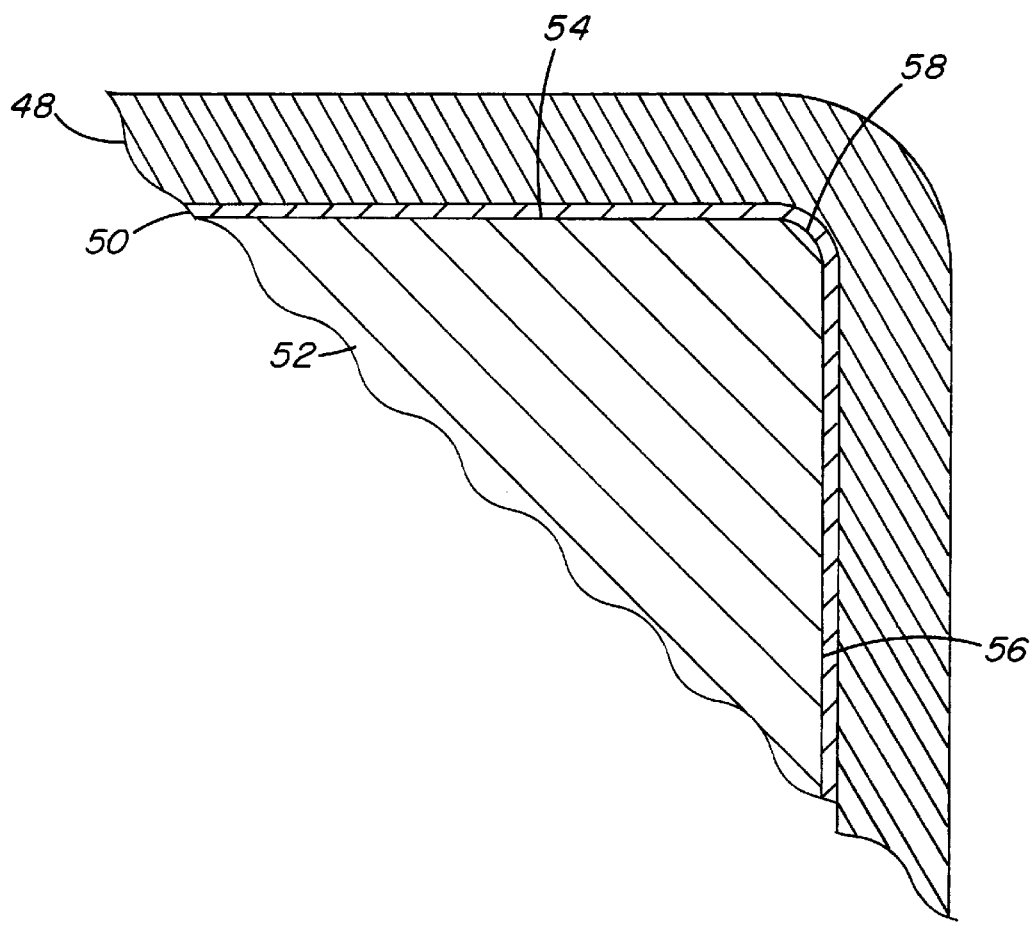
FIG. 2. shows a schematic of an enlarged cross-section of a portion of a substrate coated in Test A.

FIG. 2. shows a schematic of an enlarged cross-section of a portion of a substrate used in Test A after a TiCN coating had been applied in the test. As shown in FIG. 2, a coating of TiCN 48 was deposited on a layer of TiN 50 which had been applied to the tungsten carbide substrate's 52 rake face 54, flank face 56, and cutting edge 58 at the juncture of the rake and flank faces prior to the start of the test.

The TiCN coating thickness measurements were made on the rake face at a distance of 1 millimeter from the cutting edge. The results of the TiCN coating thickness measurements for Tests A and B are shown in Table 3. These results show that the average coating thickness increased from about 2.8 microns for the samples processed by the conventional MT CVD method to about 9.8 microns for the samples processed according to an embodiment of the present invention. Additionally, the variability of coating thickness as measured by the coefficient of variance (C.O.V.), which is the standard deviation of the thickness measurements divided by the mean thickness measurement, was reduced from 0.54 in Test B for the samples processed by the conventional MT CVD method to 0.28 in Test A for the samples processed according to an embodiment of the present invention. These results clearly show that in Test A, which was conducted in accordance with an embodiment of the present invention, the addition of a predetermined amount of HCl to a MT CVD deposition process gas that also contained predetermined amounts of $CH_3$, $TiCl_4$, $H_2$, and $N_2$ resulted in significant improvements to the both the TiCN coating deposition rate and the uniformity of the TiCN coating thickness on substrates located throughout the reaction chamber.

EXAMPLE 2

In Test C, a test of an embodiment of the present invention was conducted in which the composition of the deposition process gas was varied from that used in Test A. All other conditions were essentially the same as those used for Test A as were the substrate composition, geometry, and surface condition.

The deposition process gas composition for Test C is given in Table 1 and the MT CVD operational parameters are given in Table 2. The results of thickness measurements of the TiCN coatings deposited in Test C appear in Table 3. These results show that the practice of an embodiment of the present invention in Test C improved the deposition rates and coating uniformity over that which was obtained in Test B by a conventional MT CVD technique.

EXAMPLE 3

In Test D, a test of an embodiment of the present invention was conducted in which a temperature gradient was used in the reaction chamber so that the substrates proximal to the entrance location of the deposition process gas into the reaction chamber were heated to a reaction temperature about 40° C. lower than the reaction temperature of those substrates most remote from the deposition process gas entrance. All other conditions were essentially the same as those used for Test A as were the substrate composition, geometry, and surface condition. The deposition process gas composition for Test D is given in Table 1 and the MT CVD operational parameters are given in Table 2.

The results of thickness measurements of the TiCN coatings deposited in Test D appear in Table 3. These results show that the conditions used in Test D produced improvements in deposition rates and coating uniformity over those which were obtained in Test B by a conventional MT CVT technique. Furthermore, comparing the 0.16 C.O.V. of Test D with the 0.28 C.O.V. of Test A shows that the use of temperature gradient along with the use of a deposition process gas comprising from about 1 to about 30% HCl and 5 predetermined amounts of $CH_3CN$, $TiCl_4$, $H_2$, and $N_2$ produced a significant improvement in coating uniformity throughout the reaction chamber over that which occurred when no temperature gradient was used.

EXAMPLE 4

In Test E, an embodiment of the present invention employing a temperature gradient as in Test D was practiced but the reaction pressure was decreased from the 120 Torr level used in Test D to 90 Torr in Test E. All other conditions were essentially the same as were used for Test D as were the substrate composition, geometry, and surface condition. The deposition process gas composition for Test E is given in Table 1 and the MT CVD operational parameters are given in Table 2.

The results of thickness measurements of the TiCN coatings deposited in Test E appear in Table 3. The results of Test E in terms of deposition rate and coating uniformity are comparable to those obtained for Test D and superior to those obtained in Test B by a conventional MT CVD technique.

EXAMPLE 5

In Test F, an embodiment of the present invention was practiced in which the operational parameters were similar to those used in Test E except that the composition of the deposition process gas was changed to lower the concentrations of $TiCl_4$ and $CH_3CN$. Also, in addition to using substrates having the composition, geometry, and surface condition as were used for Test D, additional substrates of the ceramic $Si_3N_{4-1}$% yttria ($Y_2O_3$)—1% magnesia (MgO) were included (see U.S. Pat. No. 5,382,273). These ceramic substrates had a geometry of Kennametal Style SNGA433T and had not been precoated with TiN. The surfaces of these ceramic substrates were cleaned by conventional techniques known to those skilled in the art prior to use in Test F.

The deposition process gas composition for Test F is given in Table 1 and the MT CVD operational parameters are given in Table 2.

The results of thickness measurements of the TiCN coatings deposited on the cemented carbide inserts in Test F appear in Table 3. Although the ceramic $Si_3N_4$ substrates were also found to be coated with TiCN, no coating thickness measurements were taken. The results of the thickness measurements on the cemented carbide inserts show that the deposition rate of the TiCN was lower than that obtained in Test E but were still significantly greater than those obtained in Test B by a conventional MT CVD technique. The results of Test F in terms of coating uniformity are comparable to those obtained for Test D and superior to those obtained in Test B by a conventional MT CVD technique.

EXAMPLE 6

The present invention also may be used in conjunction with other coating deposition techniques. While the tests described in Examples 1–5 demonstrated that the present invention may be used to apply a TiCN coating over uncoated or over previously coated substrates, Test G demonstrates one way in which the present invention can be used intermittently with other coating techniques to construct on a substrate a multi-layer coating comprised of a variety of coating materials.

In Test G, an embodiment of the present invention was used in conjunction with conventional CVD and MT CVD coating deposition techniques to form a multilayer coating on a previously uncoated cemented tungsten carbide insert. The layers deposited in Test G are listed in Table 4. Three of these layers, layers 2, 4, and 6, were deposited using an embodiment of the present invention which employed conditions similar to those used in Test A except that the reaction pressure in Test G was 90 Torr instead of the 120 Torr used in Test A. The deposition process gas composition used in depositing layers 2, 4, and 6 in Test G is given in Table 1 and the MT CVD operational parameters for these layers are given in Table 2.

Certain aspects of the multilayer coating and the coated substrate used in Test G are the subject of another United States patent application which is also assigned to Kennametal and which is being filed on the same day as the present patent application, namely U.S. application Ser. No. 09/260,970.

Test G was conducted in the following manner. The substrates were heated to a reaction temperature of 870° C. in the manner and in the reaction vessel described above for Test A. A conventional CVD method was then used to deposit the TiN of layer 1. A MT CVD layer of TiCN, layer 2, was then applied according to an embodiment of the present invention in the manner described in Test A. A conventional CVD method was then used to deposit the TiN of layer 3. A MT CVD layer of TiCN, layer 4, was then applied according to an embodiment of the present invention in the same manner as was used for layer 2. A conventional CVD method was then used to deposit the TiN of layer 5. A MT CVD layer of TiCN, layer 6, was then applied according to an embodiment of the present invention in the same manner as was used for layers 2 and 4. The reaction temperature was then increased and conventional CVD methods were used to deposit the TiCN, TiC, $Al_2O_3$, and TiN coatings of layers 7 through 9.

Thickness measurements were made on TiCN layers 2 and 4 which were deposited in Test G by an embodiment of the present invention. The results of these thickness measurements appear in Table 5. Comparing Table 5 with Table 3, it is clear that the uniformity of the TiCN coating throughout reaction chamber is similar to that achieved in Test A and superior to that obtained in Test B by a conventional MT CVD technique.

Table 6 contains a comparison of the TiCN deposition rates achieved in Tests A through G. The results also show that the deposition rate of the TiCN in layers 2 and 4 of Test G, although lower than that obtained in Test A, were still significantly greater than that obtained in Test B by a conventional MT CVD technique.

TABLE 1

Deposition Process Gas Compositions

| Test | HCl (%) | $CH_3CN$ (%) | $TiCl_4$ (%) | $H_2$ (%) | $N_2$ (%) |
|---|---|---|---|---|---|
| A - present invention | 4.6 | 0.4 | 1.3 | 77.1 | 16.5 |
| B - conventional MT CVD | 0 | 0.5 | 1.4 | 80.9 | 17.3 |
| C - present invention | 7.5 | 0.7 | 2.1 | 62.8 | 26.9 |
| D - present invention | 4.6 | 0.4 | 1.3 | 77.1 | 16.5 |
| E - present invention | 4.6 | 0.4 | 1.3 | 77.1 | 16.5 |
| F - present invention | 4.6 | 0.3 | 0.9 | 77.6 | 16.6 |
| G* - present invention | 4.6 | 0.4 | 1.3 | 77.1 | 16.5 |

*The deposition process gas compositions given are for layers 2, 4, and 6 which were applied according to an embodiment of the present invention.

TABLE 2

MT CVD Operational Parameters

| Test | Time (hours) | Reaction Temp. (° C.) | Reaction Press. (Torr) | HCl (slpm) | $CH_3CN$ (cc/min) | $TiCl_4$ (g/min) | $H_2$ (slpm) | $N_2$ (slpm) |
|---|---|---|---|---|---|---|---|---|
| A | 3.0 | 870 | 120 | 5.0 | 1.1 | 12.0 | 84 | 18 |
| B | 3.0 | 870 | 120 | 0 | 1.1 | 12.0 | 84 | 18 |
| C | 3.0 | 870 | 120 | 5.0 | 1.1 | 12.0 | 42 | 18 |
| D | 3.0 | 830/870 | 120 | 5.0 | 1.1 | 12.0 | 84 | 18 |
| E | 3.0 | 830/870 | 90 | 5.0 | 1.1 | 12.0 | 84 | 18 |
| F | 3.0 | 830/870 | 90 | 5.0 | 0.7 | 8.0 | 84 | 18 |
| G* | 3.0 | 870 | 120 | 5.0 | 1.1 | 12.0 | 84 | 12 |

*Operational parameters for layers 2, 4, and 6 which were applied according to an embodiment of the present invention.

TABLE 3

Coating Thickness and Uniformity Measurements (Philtec method)

| Test | Thickness Tray 1 (microns) | Thickness Tray 4 (microns) | Thickness Tray 8 (microns) | Thickness Tray 11 (microns) | Average Thickness (microns) | Std. Dev. | C.O.V. |
|---|---|---|---|---|---|---|---|
| A | 10.4 | 13.3 | 8.1 | 7.3 | 9.8 | 2.7 | 0.28 |
| B | 4.3 | 3.9 | 1.7 | 1.4 | 2.8 | 1.5 | 0.54 |
| C | 9.3 | 10.2 | 7.4 | 5.9 | 8.2 | 1.9 | 0.24 |
| D | 9.9 | 11.1 | 10.1 | 7.0 | 9.5 | 1.5 | 0.16 |
| E | 9.0 | 10.0 | 10.7 | 8.2 | 9.5 | 1.1 | 0.12 |
| F | 5.6 | 6.7 | 6.8 | 5.1 | 6.1 | 0.8 | 0.14 |

TABLE 4

Coating Schedule Used in Test G

| Layer | Composition | Deposition Method | Nominal Thickness (microns) |
|---|---|---|---|
| 1 (on substrate) | TiN | CVD (conventional) | <0.5 |
| 2 | TiCN | MT CVD of present invention | 2.0 |
| 3 | TiN | CVD (conventional) | <0.5 |
| 4 | TiCN | MT CVD of present invention | 2.0 |
| 5 | TiN | CVD (conventional) | <0.5 |
| 6 | TiCN | MT CVD of present invention | 2.0 |
| 7 | TiCN/TiC/TiCN | CVD (conventional) | 1.5 |
| 8 | kappa-$Al_2O_3$ | CVD (conventional) | 1.5 |
| 9 (outer layer) | TiN | CVD (conventional) | 0.5 |

TABLE 5

Test G Coating Thickness and Uniformity Measurements for Layers Applied by an Embodiment of the Present Invention (Philtec thickness measurement method)

| Layer | Thickness Tray 1 (microns) | Thickness Tray 4 (microns) | Thickness Tray 8 (microns) | Thickness Tray 11 (microns) | Average Thickness (microns) | Std. Dev. | C.O.V. |
|---|---|---|---|---|---|---|---|
| 2 | 1.5 | 1.1 | 1.0 | 0.8 | 1.1 | 0.2 | 0.18 |
| 4 | 1.6 | 1.5 | 1.2 | 0.9 | 1.3 | 0.3 | 0.23 |

TABLE 6

Average Deposition Rates

| Test | Average Deposition Rate (microns/hour) |
|---|---|
| A - present invention | 3.3 |
| B - conventional MT CVD | 0.9 |
| C - present invention | 2.7 |
| D - present invention | 3.2 |
| E - present invention | 3.2 |
| F - present invention | 2.0 |
| G - layer 2 - present invention | 1.8 |
| G - layer 4 - present invention | 2.1 |

Although the foregoing examples were conducted in a conventional reaction vessel chamber of the design described above, it is to be understood that the present invention may be practiced in any design of reaction chamber known to those skilled in the art to be adaptable for use with conventional MT CVD.

The patents and the patent applications referred to herein are hereby incorporated by reference.

Having described presently preferred embodiments of the present invention, it is to be understood that the present invention may be otherwise embodied within the scope of the appended claims. Thus, while only a few embodiments of the present invention have been shown and described, it will be obvious to those skilled in the art that many changes and modifications may be made thereunto without departing from the spirit and scope of the present invention as described in the appended claims.

What is claimed is:

1. A MT CVD process comprising the steps of:
   a) heating at least one substrate in a reaction chamber to a reaction temperature in the range of about 550 to about 900° C., said at least one substrate having a surface; and
   b) introducing into said reaction chamber a deposition process gas comprising from about 1 to about 30% hydrogen halide and predetermined amounts of a carbon/nitrogen source, a metal-halogen compound, and $H_2$ so that a metal carbonitride-containing coating deposits on said surface of said at least one substrate.

2. The process described in claim 1 wherein said hydrogen halide is selected from the group consisting of HCl, HI, HBr, and HF, wherein said carbon/nitrogen source is selected from the group consisting of $CH_3CN$, $CH_3NH_2$, $(CH_3)_2NH$, $(CH_3)_3N$, HCN, and $CH_3(NH)_2CH_3$, and wherein said metal-halogen compound is selected from the group consisting of the flourides, chlorides, bromides, and iodides of Ti, Hf, Nb, V, Zr, and Ta and their mixtures and alloys.

3. The process described in claim 1 wherein said deposition process gas also includes a predetermined amount of at least one gas selected from the group consisting of $N_2$, CO and $CO_2$.

4. The process described in claim 1 wherein said carbonitride-containing coating is selected from the group consisting of carbonitrides, oxycarbonitrides, and borocarbonitrides of Ti, Hf, Zr, V, Nb, and Ta and their mixtures and alloys.

5. The process described in claim 1 further comprising the step of maintaining a reaction pressure of about 5 to about 800 Torr.

6. The process described in claim 1 wherein said at least one substrate includes at least one substrate selected from the group consisting of ceramics, cemented carbides, cermets, and high speed steels.

7. The process described in claim 6 wherein said at least one substrate selected from the group consisting of ceramics, cemented carbides, cermets, and high speed steels includes at least one cutting tool.

8. A MT CVD process comprising the steps of:
   a) heating a plurality of substrates in a reaction chamber to a reaction temperature range of from about 550 to about 900° C. in such a manner as to establish a temperature gradient among the substrates so that a substrate proximal to an entrance location of a deposition process gas is heated to a lower reaction temperature than a substrate distal from said entrance location, each substrate of said plurality having a surface; and
   b) introducing into said reaction chamber a deposition process gas comprising from about 1 to about 30% hydrogen halide and predetermined amounts of a carbon/nitrogen source, a metal-halogen compound, and $H_2$ so that a carbonitride-containing coating deposits on said surface of each substrate of said plurality.

9. The process described in claim 8 wherein said hydrogen halide is selected from the group consisting of HCl, HI, HBr, and HF, wherein said carbon/nitrogen source is selected from the group consisting of $CH_3CN$, $CH_3NH_2$, $(CH_3)_2NH$, $(CH_3)_3N$, HCN, and $CH_3(NH)_2CH_3$, and wherein said metal-halogen compound is selected from the group consisting of the flourides, chlorides, bromides, and iodides of Ti, Hf, Nb, V, Zr, and Ta and their mixtures and alloys.

10. The process described in claim 8 wherein said deposition process gas also includes a predetermined amount of at least one gas selected from the group consisting of $N_2$, CO and $CO_2$.

11. The process described in claim 8 wherein said carbonitride-containing coating is selected from the group consisting of carbonitrides, oxycarbonitrides, and borocarbonitrides of Ti, Hf, Zr, V, Nb, and Ta and their mixtures and alloys.

12. The process described in claim 8 wherein said reaction temperature gradient is in the range of about 10 to about 100° C. and further comprising the step of maintaining a reaction pressure of about 5 to about 800 Torr.

13. The process described in claim 8 wherein said at least one substrate includes at least one substrate selected from the group consisting of ceramics, cemented carbides, cermets, and high speed steels.

14. The process described in claim 13 wherein said at least one substrate selected from the group consisting of ceramics, cemented carbides, cermets, and high speed steels includes at least one cutting tool.

15. A MT CVD process comprising the steps of:
   a) heating at least one substrate in a reaction chamber to a reaction temperature, said at least one substrate having a surface; and
   b) introducing into said reaction chamber a deposition process gas comprising from about 1 to about 30% HCl and predetermined amounts of $CH_3CN$, $TiCl_4$, and $H_2$ so that a coating of TiCN deposits on said surface of said at least one substrate.

16. The process described in claim 15, wherein said deposition process gas comprises from about 0.2 to about 3.0% $CH_3CN$, from about 0.5 to about 5.0% $TiCl_4$, from about 0 to about 35% $N_2$ and from about 40 to about 98% $H_2$.

17. The process described in claim 16 wherein said reaction temperature is in the range of about 600 to about 900° C. and further comprising the step of maintaining a reaction pressure of about 5 to about 800 Torr.

18. The process described in claim 16 wherein said reaction temperature is in the range of about 830 to about 880° C. and further comprising the step of maintaining a reaction pressure of about 40 to about 120 Torr.

19. The process described in claim 16 wherein said at least one substrate includes at least one substrate selected from the group consisting of ceramics, cemented carbides, cermets, and high speed steels.

20. The process described in claim 19 wherein said at least one substrate selected from the group consisting of ceramics, cemented carbides, cermets, and high speed steels includes at least one cutting tool.

21. The process described in claim 15, wherein said deposition process gas comprises from about 2.3 to about 20% HCl, from about 0.3 to about 0.7% $CH_3CN$, from about 0.9 to about 2.1% $TiCl_4$, from about 10 to about 30% $N_2$, and from about 50 to about 85% $H_2$.

22. The process described in claim 21 wherein said reaction temperature is in the range of about 600 to about 900° C. and further comprising the step of maintaining a reaction pressure of about 5 to about 800 Torr.

23. The process described in claim 21 wherein said reaction temperature is in the range of about 830 to about 880° C. and further comprising the step of maintaining a reaction pressure of about 40 to about 120 Torr.

24. The process described in claim 21 wherein said at least one substrate includes at least one substrate selected from the group consisting of ceramics, cemented carbides, cermets, and high speed steels.

25. The process described in claim 24 wherein said at least one substrate selected from the group consisting of ceramics, cemented carbides, cermets, and high speed steels includes at least one cutting tool.

26. A MT CVD process comprising the steps of:
   a) heating a plurality of substrates in a reaction chamber to a reaction temperature range of from about 600 to about 900° C. in such a manner as to establish a temperature gradient among the substrates so that a substrate proximal to an entrance location of a deposition process gas is heated to a lower reaction temperature than a substrate distal from said entrance location, each substrate of said plurality having a surface; and b) introducing into said reaction chamber said deposition process gas comprising from about 1 to about 30% HCl and predetermined amounts $CH_3CN$, $TiCl_4$, and $H_2$ so that a coating of TiCN deposits on said surface of each substrate of said plurality.

27. The process described in claim 26 wherein said deposition process gas comprises from about 0.2 to about 3.0% $CH_3CN$, from about 0.5 to about 5.0% $TiCl_4$, from about 0 to about 35% $N_2$, and from about 40 to about 98% $H_2$.

28. The process described in claim 27 wherein said temperature gradient is in the range of about 10 to about 100° C. and further comprising the step of maintaining a reaction pressure of about 5 to about 800 Torr.

29. The process described in claim 27 wherein said temperature gradient is in the range of about 30 to about 50° C. and further comprising the step of maintaining a reaction pressure of about 40 to about 120 Torr.

30. The process described in claim 27 wherein said at least one substrate includes at least one substrate selected from the group consisting of ceramics, cemented carbides, cermets, and high speed steels.

31. The process described in claim 30 wherein said at least one substrate selected from the group consisting of ceramics, cemented carbides, cermets, and high speed steels includes at least one cutting tool.

32. The process described in claim 26, wherein said deposition process gas comprises from about 2.3 to about 20% HCl, from about 0.3 to about 0.7% $CH_3CN$, from about 0.9 to about 2.1% $TiCl_4$, from about 10 to about 30% $N_2$, and from about 50 to about 85% $H_2$.

33. The process described in claim 32 wherein said temperature gradient is in the range of about 10 to about 100° C. and further comprising the step of maintaining a reaction pressure of about 5 to about 800 Torr.

34. The process described in claim 32 wherein said temperature gradient is in the range of about 30 to about 50° C. and further comprising the step of maintaining a reaction pressure of about 40 to about 120 Torr.

35. The process described in claim 32 wherein said at least one substrate includes at least one substrate selected from the group consisting of ceramics, cemented carbides, cermets, and high speed steels.

36. The process described in claim 33 wherein said at least one substrate selected from the group consisting of ceramics, cemented carbides, cermets, and high speed steels includes at least one cutting tool.

37. A MT CVD process comprising the steps of:

a) heating a plurality of substrates in a reaction chamber to a reaction temperature range of from about 830 to about 880° C. in such a manner as to establish a temperature gradient among the substrates so that a substrate proximal to an entrance location of a deposition process gas is heated to a lower reaction temperature than a substrate distal from said entrance location, each substrate of said plurality having a surface; and b) introducing into said reaction chamber said deposition process gas comprising from about 1 to about 30% HCl and predetermined amounts $CH_3CN$, $TiCl_4$, $H_2$, and $N_2$ so that a coating of TiCN deposits on said surface of each substrate of said plurality.

38. The process described in claim 37 wherein said deposition process gas comprises from about 0.2 to about 3.0% $CH_3CN$, from about 0.5 to about 5.0% $TiCl_{41}$ from about 0 to about 35% $N_2$, and from about 40 to about 98% $H_2$.

39. The process described in claim 38 wherein said temperature gradient is in the range of about 30 to about 50° C. and further comprising the step of maintaining a reaction pressure of about 5 to about 800 Torr.

40. The process described in claim 38 wherein said temperature gradient is in the range of about 30 to about 50° C. and further comprising the step of maintaining a reaction pressure of about 40 to about 120 Torr.

41. The process described in claim 38 wherein said at least one substrate includes at least one substrate selected from the group consisting of ceramics, cemented carbides, cermets, and high speed steels.

42. The process described in claim 41 wherein said at least one substrate selected from the group consisting of ceramics, cemented carbides, cermets, and high speed steels includes at least one cutting tool.

43. The process described in claim 37, wherein said deposition process gas comprises from about 2.3 to about 20% HCl, from about 0.3 to about 0.7% $CH_3CN$, from about 0.9 to about 2.1% $TiCl_4$, from about 10 to about 30% $N_2$, and from about 50 to about 85% $H_2$.

44. The process described in claim 43 wherein said temperature gradient is in the range of about 30 to about 50° C. and further comprising the step of maintaining a reaction pressure of about 5 to about 800 Torr.

45. The process described in claim 43 wherein said temperature gradient is in the range of about 30 to about 50° C. and further comprising the step of maintaining a reaction pressure of about 40 to about 120 Torr.

46. The process described in claim 43 wherein said at least one substrate includes at least one substrate selected from the group consisting of ceramics, cemented carbides, cermets, and high speed steels.

47. The process described in claim 46 wherein said at least one substrate selected from the group consisting of ceramics, cemented carbides, cermets, and high speed steels includes at least one cutting tool.

* * * * *